United States Patent [19]
Hamilton et al.

[11] Patent Number: 5,483,025
[45] Date of Patent: Jan. 9, 1996

[54] UNITARY MICRO-FLEXURE STRUCTURE

[75] Inventors: Harold J. Hamilton, Santa Clara; Timothy W. Martin, Los Altos, both of Calif.

[73] Assignee: Censtor Corporation, San Jose, Calif.

[21] Appl. No.: 441,254

[22] Filed: May 15, 1995

Related U.S. Application Data

[63] Continuation-in-part of Ser. No. 441,716, Nov. 27, 1989, Pat. No. 5,041,932, and a continuation of Ser. No. 990,005, Dec. 10, 1992, abandoned, which is a division of Ser. No. 746,916, Aug. 19, 1991, abandoned.

[51] Int. Cl.$^6$ ........................................ H05K 1/18
[52] U.S. Cl. ..................... 174/254; 174/250; 360/104; 361/749
[58] Field of Search ............... 174/250, 254, 174/255, 261; 361/749; 439/65; 29/603; 360/104, 126

[56] References Cited

U.S. PATENT DOCUMENTS

| | | | |
|---|---|---|---|
| 4,517,616 | 5/1985 | Bischoff | 360/126 |
| 4,558,385 | 12/1985 | Kaminaka et al. | 360/126 |
| 4,687,695 | 8/1987 | Hamby | 428/192 |
| 4,703,383 | 10/1987 | Katou et al. | 360/126 |
| 4,730,146 | 3/1988 | Maser et al. | 313/511 |
| 4,734,802 | 3/1988 | Higuchi et al. | 360/103 |
| 4,739,431 | 4/1988 | Yasuda et al. | 360/126 |
| 4,809,103 | 2/1989 | Lazzari | 360/126 |
| 4,819,091 | 4/1989 | Brezoczky et al. | 360/97.01 |
| 4,855,854 | 8/1989 | Wada et al. | 360/126 |
| 4,860,139 | 8/1989 | Hamilton | 360/126 |
| 4,876,790 | 10/1989 | Grimm et al. | 29/603 |
| 4,897,747 | 1/1990 | Mennier et al. | 360/122 |
| 4,943,882 | 7/1990 | Wada et al. | 360/126 |
| 4,949,207 | 8/1990 | Lazzari | 360/119 |
| 5,041,932 | 8/1991 | Hamilton | 360/104 |
| 5,065,271 | 11/1991 | Matsuura et al. | 360/126 |
| 5,073,242 | 12/1991 | Hamilton | 29/603 X |
| 5,111,351 | 5/1992 | Hamilton | 360/104 |
| 5,126,903 | 6/1992 | Matsuzaki | 360/104 |
| 5,163,218 | 11/1992 | Hamilton | 29/603 |
| 5,174,012 | 12/1992 | Hamilton | 29/603 |

OTHER PUBLICATIONS

"The High Speed Flexible Disk Using a Micro-Head," Yasuda, IEEE Translation Journal on Magnetics in Japan, vol. 3, No. 8, Aug. 1988, p. 624.

"A Single Pole Type Thin Film Head With a Narrower Gap Length," Murata, Journal of The Magnetics Society of Japan, vol. 13, Supplement, No. S1, 1989, p. 517.

"A New Thin Film Head Generation IC Head," Lazzari, IEEE Transaction on Magnetics, vol. 25, No. 5, Sep. 1989, p. 3190.

"An Active Slider for Practical Contact Recording," Yeack-Scranton, IEEE Transactions on Magnetics, vol. 26, No. 5, Sep. 1990, p. 2478.

*Primary Examiner*—Laura Thomas

[57] ABSTRACT

A unitary micro-flexure structure and a method of making the same, wherein the structure takes the form of an elongate dielectric flexure body having a mounting end and a free end, and which is adapted for cantilevered disposition, wherein the body takes a form which is constructed entirely from thin-film deposition and patterning processes involving the deposition of a metal oxide, and further wherein the body has a topography which is at least partially determined by etch-removable surface-boundary-defining structure.

12 Claims, 1 Drawing Sheet

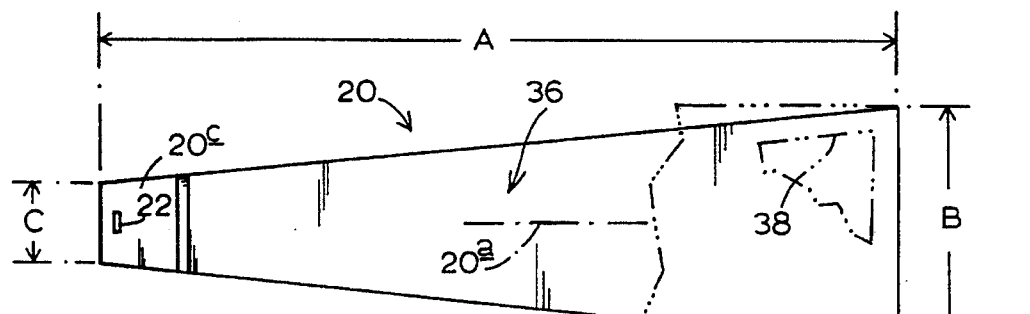
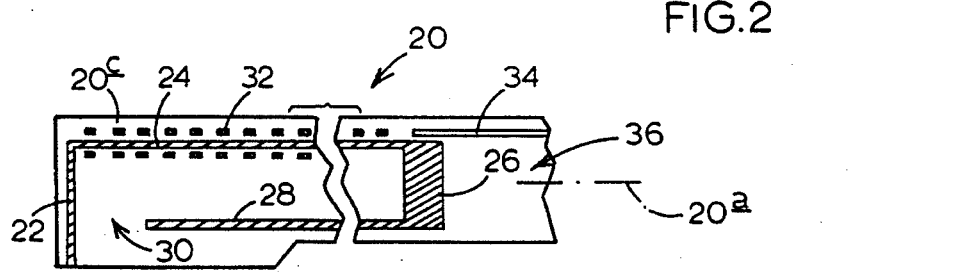
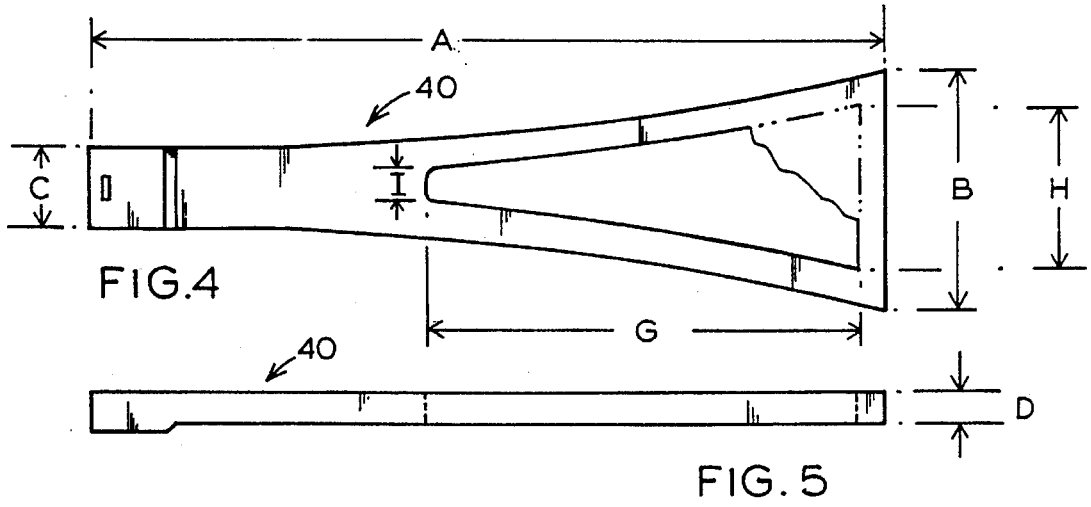

UNITARY MICRO-FLEXURE STRUCTURE

This application is a continuation of Ser. No. 07/990,005, filed Dec. 10, 1992, and now abandoned, which was a divisional of Ser. No. 07/746,916, filed Aug. 19, 1991, and now abandoned. This application is also a continuation-in-part of Ser. No. 07/441,716, filed Nov. 27, 1989, and now U.S. Pat. No. 5,041,932.

BACKGROUND AND SUMMARY OF THE INVENTION

This invention relates to a unitary micro-flexure structure, and to a method of making the same. A preferred embodiment of the invention is described herein in a setting wherein the invention finds particular applicability, and namely in the setting of an electromagnetic read/write structure for the reading and writing of magnetic images on and with respect to a relatively moving magnetic recording medium, such as a disk or drum. Thus, and in the setting of this read/write application, the invention relates to a unique, unitary, elongate, integrated read/write head/flexure/conductor cantilever structure of extremely small size, which structure includes an elongate flexure body with a stretch which is specially formed, and in certain modifications progressively diminished in cross section, e.g., tapered, in the direction from the body's mounting end toward its free end.

The structure of this invention, in the read/write setting expressed above, offers, in certain applications, decided improvements in dynamic mechanical performance over generically, similar structures which are disclosed in four of my prior-filed U.S. patents applications: Ser. Nos. 07/441,716, filed Nov. 27, 1989, for "INTEGRATED MAGNETIC READ/WRITE HEAD/FLEXURE/CONDUCTOR STRUCTURE", 07/632,958, filed Dec. 21, 1990, for "METHOD OF MAKING INTEGRATED MAGNETIC READ/WRITE HEAD/FLEXURE/CONDUCTOR STRUCTURE" (as amended), 07/710,561, filed Jun. 5, 1991, for "INTEGRATED MAGNETIC READ/WRITE HEAD/FLEXURE/CONDUCTOR STRUCTURE", and 07/710,891, filed Jun. 11, 1991 for "INTEGRATED MAGNETIC READ/WRITE HEAD/FLEXURE/CONDUCTOR STRUCTURE". Much of the important background of the invention disclosed and claimed herein, as well as a fully detailed description of read/write-application internal electromagnetic structure, and of a preferred fabrication methodology, are found in those prior-filed applications, and accordingly, and in order to avoid unnecessary, detailed repetition herein, the entire contents of these four referenced patent applications are hereby incorporated by reference.

In the structure disclosed in these earlier application documents, an elongate flexure body is illustrated which has a substantially uniform cross-sectional area, and lateral dimension, along nearly all of its length, extending between its mounting end and its free, magnetic-"head-carrying" end. Such construction has been proven to offer wide, successful applicability in many read/write systems applications, for all of the special reasons expressed in the earlier-filed, referenced patent applications.

Described and set forth, inter alia, in these earlier documents is a unique manufacturing technique wherein etchable walls, or stripes, that are "laid down" during the explained thin-film deposition and patterning processes, are used to define the lateral boundaries (dimensions) of the final structures. This unique fabrication methodology has led us to recognize how readily it lends itself to simple and easily controlled fabrication of micro-flexure structures with bodies having not only uniform cross-sectional dimensions, but also with graduated and changing cross-sectional areas and lateral dimensions along their lengths. Both simple and complex shapes are easily attained. Micro-flexure bodies can thus be uniquely designed to offer, readily, a wide variety of desired mechanical spring characteristics, resonance characteristics, dynamic-reaction characteristics, etc., to suit different specific systems applications.

Clearly as important as uniform dimensionality, among different, desired, cantilever flexure bodies usable, for example in a read/write setting, is a body which exhibits a graduated, or tapered, lateral configuration, and accordingly a graduated cross-sectional area progressing, generally, from larger adjacent the mounting end toward smaller adjacent the read/write, head-carrying end. Given the etchable wall/stripe fabrication technology expressed in the above-referenced prior documents as an available manufacturing technology, an infinite variety of graduated/tapered configurations are easily and inexpensively possible.

Accordingly, the present invention proposes several unique, different generic forms of a flexure body, including tapered bodies, in a structure of the type generally outlined above, with some of these bodies including, and some not including, mass-reducing and dynamic-performance-differentiating, through-body void spaces. The special kinds of different performance enhancements which are achievable through such graduated topographies will be discussed in detail in the descriptions presented below.

Plainly among the important advantages offered and attained by the present invention are that flexure topography can be controlled with infinite variety, and that the same can be fabricated in a fashion which allows for very closely controlled fine-tuning of mechanical performance specifications. Similarly significant is that all of this can be achieved with great manufacturing simplicity, and in particular, with a manufacturing approach which does not require expensive, tricky, and potentially low-yield-producing and damaging machining operations.

These and other important objects and advantages that are offered by the present invention will become more fully apparent as the description which now follows is read in conjunction with the accompanying drawings.

DESCRIPTION OF THE DRAWINGS

FIG. 1 is a working-side plan view of a micro-flexure structure (this figure being employed to depict three modifications) constructed in accordance with the present invention—such structure being intended for magnetic read/write applications, and thus including integrated read/write head and related electrical structure.

FIG. 2 is a side elevation taken from the upper side of FIG. 1.

FIG. 3 is an enlarged, longitudinal, lateral cross section of a fragment of the structure of FIGS. 1 and 2, illustrating integration therein of a probe-type head, and of an electrical coil and conductive traces connecting therewith, all of the latter being formed within the embedding, elongate, dielectric flexure body of the micro-flexure structure.

FIG. 4 is a working-side plan view of an alternative, curvilinearly configured embodiment of a micro-flexure structure (two more modifications being depicted here) constructed in accordance with the present invention.

FIG. 5 is a side elevation taken from the upper side of FIG. 4.

DETAILED DESCRIPTION, AND BEST MODE FOR CARRYING OUT, THE INVENTION

Turning now the drawings, and referring first of all to FIGS. 1–3, inclusive, indicated generally at 20 is a micro-flexure structure, herein illustrated as a read/write head/flexure/conductor structure, which is constructed in accordance with the present invention. Structure 20 in this, and in all other embodiments disclosed herein, has an overall mass which is less than about 3.0-milligrams. As has been indicated above in the description of the drawing figures, FIG. 1 is employed herein to illustrate, alternatively, three different modifications of one outline-type (rectilinear) embodiment of the invention. The fragmentary dash-triple-dot lines indicate a generally orthogonal rectilinear micro-flexure structure like the structure which is illustrated in the above-reference patent applications. The solid lines in this figure illustrate a solid-body, tapered modification. And, the fragmentary region shown in dash-double-dot lines is to be read, as will be explained shortly, to illustrate a tapered modification with a through-the-body void space.

With respect to the first-mentioned modification, shown in dash-triple-dot lines fragmentarily, the reader is referred to the referenced patent applications for a topographic, full representation of this "uniform-dimensionality" micro-flexure structure. Continuing, therefore, with what else is shown in these figures, as can be seen in FIG. 1, and referring to the "solid line" modification, structure 20, relative to its longitudinal axis 20a, *is uniformly and symmetrically tapered in* a rectilinear fashion in the stretch which extends between its mounting end 20b *and its free, "head-carrying" end* 20c.

Structure 20, in the form now being described as being illustrative, has an overall cantilever length A of about 10.2-millimeters, a width B, adjacent mounting end 20b, *of* about 1.0-millimeters, a width C, adjacent free end 20c, *of* about 0.5-millimeters, and a thickness D, throughout most of its length, of about 40-micrometers.

The particular dimensions just presented above are representative of values that have been found to work particularly well in many circumstances requiring what is the key offering of the present invention—namely, special attention to enhancing certain features of mechanical performance, such as those expressed earlier. These illustrative values lie within preferred ranges of values which are set forth immediately below:

A 5–12.7-millimeters
B 0.25–1.27-millimeters
C 0.13–0.76-millimeters
D 15–64-micrometers As can be seen especially in FIG. 3, the micro-flexure read/write structure now being described is formed with a probe-type head for perpendicular recording, with this head including a main pole 22, a yoke 24, a back-gap stud 26, and a flux-return yoke 28. These components, referred to collectively as read/write pole structure, are magnetically coupled to form a low-reluctance path, terminating in a high-reluctance gap 30 between main pole 22 and the end of flux-return yoke 28. Further details of the construction and operation of the magnetic components just described, in relation to a magnetic recording medium, are found in several of the disclosures of the prior-filed patent applications mentioned earlier.

Digressing momentarily from the structure illustrated herein, it is not at all necessary that, in a magnetic read/write application, a probe-type head be incorporated in the structure 20. More specifically, and as is plainly expressed in material elaborated in the referenced prior-filed applications, other kinds of read/write heads for specific use in conjunction with other-than-perpendicular kinds of recording may readily be used.

Continuing with FIGS. 1, 2 and 3, inductively coupled to yoke 24 in structure 20 is electrical structure including an electrically conductive helix coil 32, the ends of which coil connect through lead conductors, such as conductor 34, to suitable connective bonding pads (not shown) formed adjacent the mounting end of structure 20.

The magnetic read/write pole structure, and the electrical coil and conductor structure (means), just generally described, are formed preferably in the manner set forth in detail in the referenced prior-application material as structure embedded within an elongate, dielectric flexure body which is made herein of a suitable metal oxide, such as, for example, aluminum oxide. Alternatively, recognized, usable flexure-body materials include silicon dioxide, diamond-like carbon, as well as others.

The modification suggested by dash-double-dot lines which appear on flexure body 36 in FIG. 1 is one wherein this body is formed with a through-the-body void space which both lightens the mass of the overall structure, and offers some slightly different mechanical dynamic/spring/resonance, etc., characteristics. A fragment of such a void space is shown generally at 38, and this fragment (were it fully shown in FIG. 1) represents a void space that has generally the same kind of appearance as the void space which appears in nearly complete solid-perimetral-outline form in the structural embodiment illustrated in FIG. 4. Referring to, and thus borrowing, letter designators for void-space dimensions that appear in FIG. 4, and relating these to corresponding measurements for void space 38, space 38 has a lateral dimension H, adjacent the mounting end of structure 20, of about 0.5-millimeters, a lateral width I, located toward its terminus roughly midway between opposite ends of structure 20, of about 0.13-millimeters, and an overall length G of about 7.6-millimeters.

By employing this trapezoidal flexure in a disk drive application, the mechanical, dynamic, and resonant characteristics of the flexure beam can be modified and optimized to achieve a given set of disk drive design/performance parameters. When compared to a rectangular shaped flexure, a trapezoidal flexure beam having a free-end width equal to the width of rectangular beam (where the free-end is located at the narrowest end of the trapezoidal beam) has a dramatically increased lateral resonant frequency, a slightly increased vertical resonant frequency, and a moderately decreased torsional resonant frequency. These resonance improvements are achieved at the expense of a slight flexure beam mass increase, but the advantage gained by improving the lateral resonant frequency, which is the mode that first limits the performance of flexure beams used in disk drive applications, far outweighs the tradeoffs required.

In contact recording disk drive applications, the higher flexure structure mass can be tolerated so long as the "effective mass" of the head and flexure combination is less than about 1.5-milligrams, beyond which point it is believed that the effective mass or inertia of the head/flexure combination would create an unacceptable risk of catastrophic wear when the head operated in contact with a high speed rotating rigid disk. The "effective mass" of a head and flexure combination is the equivalent free mass that would accelerate at the same rate as the head structure when subjected to a given net inertial force in a direction perpendicular to the disk surface. When a net force is applied to the head structure in a direction perpendicular to surface of the disk, the resultant acceleration of the head is determined not only by the actual mass of the head structure, but also by the mass of a portion of the flexure beam, which necessarily moves along with the head. The effective mass of typical head/flexure combinations can be approximated by adding one-fourth to one-third of the mass of the flexure structure to the mass of the head structure, and in present air-bearing "micro-slider" heads (also referred to as "seventy-percent slider"), the effective mass is about 26.5-milligrams. In contrast, the effective mass of the head/flexure combination employed in a preferred embodiment of the present invention is only about 1.0-milligrams (⅓ ×3-milligrams mass for the trapezoidal flexure beam—in this embodiment, the head structure adds only trivial mass contributions), which is below the threshold at which the risk of catastrophic wear or head crash arising from head/disk contact becomes a significant limiting factor on component reliability.

When used within a servo loop, head/flexure components having higher resonant frequencies permit the servo electronics to be designed utilizing a higher bandwidth, which allows faster and more accurate positioning. Additionally, the higher bandwidth servo provides a stiffer servo response, which allows a disk drive utilizing such a servo to respond faster to externally applied disturbances, such as shock and vibration. In addition to faster access capability, the increased accuracy of the high bandwidth servo, coupled with the stiff mechanical components, permits higher track densities to be achieved.

Although vertical stiffness is increased somewhat through the use of trapezoidal flexure design, an excessive increases in vertical stiffness arising from the trapezoidal configuration cart easily be offset by utilizing the versatile flexure fabrication technique disclosed herein. For example, the free end of the trapezoidal flexure could be narrowed or the entire beam could be made thinner in order to reduce the vertical stiffness, while still maintaining a high resonant frequency in the lateral mode. These techniques would also lower the effective mass of the head structure. Alternatively, the trapezoidal flexure structure may employ a void space in order to control the vertical stiffness of the flexure without compromising the lateral stiffness. The void space would also reduce the effective mass of the head/flexure structure. The vertical stiffness of the flexure must be carefully controlled because if the vertical stiffness is too high, the head/flexure structure will be overly sensitive to small changes in the height of the disk surface. Conversely, a low vertical stiffness may provide an insufficient force to maintain a uniform contact between the head and disk during operation.

Turning attention now to FIGS. 4 and 5, these figures show at 40 an additional embodiment of a read/write head/flexure/conductor structure, with structure 40 being substantially the same in all respects (two modifications being illustrated by these figures) as what is shown in FIGS. 1–3, inclusive, with the exception that the tapering outline of the integrated flexure body, from its mounting end toward its free end, is characterized by curvilinearity, and more particularly, by the slight concave curvilinearity clearly apparent in FIG. 4. Solid lines in the center of structure 40 illustrate a through-the-body void space—fragmented at one end (the right end) to illustrate a body structure without such a void space.

Building on the teachings set forth in the discussion on the trapezoidal flexure beams, a curvilinear design can be fabricated which further optimizes the resonant, mechanical, and dynamic characteristics of a flexure beam. Computer aided design and simulation tools can be used to provide curvilinear flexure beam shapes that optimize lateral resonance while minimizing increases in mass and vertical stiffness. Designs can include optimized solid curvilinear flexure beams, as well as curvilinear beams having void spaces as shown in FIG. 4. Due to the novel flexure beam fabrication technique disclosed herein, these shapes can be made with a minimum increase in manufacturing complexity over rectangular and trapezoidal shapes.

All of the embodiments of the micro-flexure structure of the invention are formed utilizing a unique methodology wherein an etch resistant material such as a metal oxide is patterned and deposited on a suitable substrate structure to have a predefined outline and topography, wherein the substrate is prepared with a chemically etchable layer, and with a pair of commonly chemically etchable lateral-dimension-boundary-defining walls/stripes. The layer and walls/stripes allow for infinite choice in the outline shape of a micro-flexure, and through a common chemical etching step are removed to free individual units. Fuller details of how such a layer and walls/stripes are created and utilized during a patterning and deposition procedure are extensively expressed in materials set forth in the above-referenced patent applications.

Therefore, there is thus proposed by the present invention, a micro-flexure structure, and a method of making the same, which offer a very high degree of precision, infinitely variable control over the topography, and therefore the various performance characteristics, of a micro-flexure structure.

It is desired to secure and claim by Letters Patent:

1. A unitary micro-flexure structure comprising
   an elongate, spring-like flexure body having a plurality of adjoined solid layers including an integral electrical conductor structure extending lengthwise, and an end portion holding a magnetic pole structure.
2. The micro-flexure structure of claim 1, wherein said body is formed of a metal oxide.
3. The micro-flexure structure of claim 1, wherein said body is formed of aluminum oxide.
4. The micro-flexure structure of claim 1, wherein said body is formed of silicon dioxide.
5. The micro-flexure structure of claim 1, wherein said body is formed of diamond-like carbon.
6. The micro-flexure structure of claims 1, 2, 3, 4 or 5, wherein said end portion has a transverse protrusion exposing a tip of said pole structure.
7. A unitary micro-flexure structure comprising
   an elongate, flexure body having a mounting end, a free end and an under-surface,
   an electrical conductor structure integrated within said body, and
   a read/write transducer structure connected to the electrical conductor structure and disposed near the free end of the flexure body, wherein the transducer structure includes a magnetic pole structure circumsurrounded by material protruding from the under-surface of the flexure body.
8. The micro-flexure structure of claim 7, wherein said body has a tapered section between said mounting end and said free end.
9. The micro-flexure structure of claim 7, wherein said pole structure projects transversely relative to said flexure body.
10. An electromagnetic information storage system comprising
   an elongate flexible body portion including a first conductive structure integrated within the body portion,
   a rigid recording medium having a surface facing toward the body portion, a mechanism for moving the medium relative to the body portion, and a transducer portion including a pole structure, and a second conductive structure coupled electrically with the first conductive structure, wherein the body portion and the transducer portion are cooperatively operable to read and write information while maintaining substantially continuous contact between the pole structure and the relatively moving medium.

11. The read/write head/flexure/conductor structure of claim 10 wherein the body portion and the transducer portion constitute a single integrated unit.

12. The read/write head/flexure/conductor structure of claim 10, wherein the second conductive structure includes an inductive winding.

* * * * *